United States Patent [19]

Thommen

[11] Patent Number: 4,893,095

[45] Date of Patent: Jan. 9, 1990

[54] FREQUENCY STABILIZED OSCILLATOR

[75] Inventor: Werner F. Thommen, Staefa, Switzerland

[73] Assignee: U.S. Philips Corporation, New York, N.Y.

[21] Appl. No.: 225,338

[22] Filed: Jul. 28, 1988

[30] Foreign Application Priority Data

Aug. 4, 1987 [NL] Netherlands .......................... 8701831

[51] Int. Cl.$^4$ .............................................. H03B 1/00
[52] U.S. Cl. .................................... 331/57; 331/108 B
[58] Field of Search ...................... 331/57, 108 B, 135, 331/175, 177 R

[56] References Cited

U.S. PATENT DOCUMENTS 4,015,219 3/1977 Kawagoe et al. ................. 331/57 X
4,072,910 2/1978 Dingwall et al. ...................... 331/57

OTHER PUBLICATIONS

Paul R. Gray and Robert G. Meyer, Analysis and Design of Analog Integrated Circuits, John Wiley and Sons, pp. 730–733.

Primary Examiner—Eugene R. Laroche
Assistant Examiner—Robert J. Pascal
Attorney, Agent, or Firm—Bernard Franzblau

[57] ABSTRACT

An oscillator, for example, a ring oscillator, comprises an oscillator stage which includes a current source in series with a parallel connection of a switching element (a transistor) and a capacitance. A delay circuit is connected between the junction point of the current source and the parallel connection and the input of the switching element. The oscillation frequency is determined to a suitable approximation by the capacitance and by the ratio of the magnitude of the switching threshold of the switching element and the current to be supplied by the current source. A frequency stabilization means for the oscillator adjusts the current to be delivered by the current source by means of a resistor so that the ratio of this current and the switching threshold is proportional to the value of the resistor. The constant resistance value of the resistor is then a factor which determines the oscillation frequency.

8 Claims, 2 Drawing Sheets

FREQUENCY STABILIZED OSCILLATOR

BACKGROUND OF THE INVENTION

This invention relates to an oscillator comprising, connected between a first and a second power supply terminal, a series connection of a current source which is controllable by frequency stabilization means and which is connected to the second power supply terminal and a parallel connection of a capacitive load and a current path of a switching element, which parallel connection is connected to the first power supply terminal, a junction point between the controllable current source and the parallel connection being fed back, via a delay circuit, to a control connection of the switching element.

An oscillator of this kind is known from U.S. Pat. No. 4,015,219. The known oscillator is a ring oscillator comprising cyclically cascaded stages, a stage comprising a series connection of the current paths of a first and a second field effect transistor. The current paths of the first and second transistors are connected to the first and second power supply terminal, respectively. A junction point between the current paths is connected to the gate electrode of the first transistor in the next stage. In all stages but one the junction point is connected to the first power supply terminal via a capacitance. The stage which does not include such a capacitance acts as an output stage. The gate electrode of the second transistors is connected to the frequency stabilization means. The frequency stabilization means comprise a parallel connection of the current paths of a third and a fourth transistor which are connected on the one side to the first power supply terminal and on the other side to the second power supply terminal via a resistor. The gate electrodes of the third and fourth transistors are connected to the second power supply terminal and the first power supply terminal, respectively. The junction point between the parallel connection and the resistor is connected to the gate electrode of each second transistor. The first and the third transistor are substantially identical and of the P-channel enhancement type; the second and the fourth transistor are substantially identical and of the P-channel depletion type. The operation of the known frequency stabilization means is as follows. When the temperature of the circuit rises, the switching threshold of the first transistor, necessary for conducting the current source, increases. Consequently, the charging current decreases and hence the oscillation period increases, because a longer period of time is required for raising the capacitance to a voltage equal to the switching threshold. The impedance of the parallel connection in the frequency stabilization means also increases so that the voltage at the junction point increases. Consequently, the second transistor supplies more current, counteracting the effect of the temperature rise. When the voltage on the second power supply terminal increases, the current through the second transistor increases. This reduces the oscillation period because the voltage across the capacitance increases faster so as to reach the switching threshold sooner. The current through the third transistor, however, also increases, so that the voltage at the junction point causes a decrease of the control voltage for the second transistor and the current therethrough decreases. This counteracts the effect of fluctuations of the power supply voltage.

The known frequency stabilization means must be very accurately proportioned in order to avoid overcompensation or undercompensation. This is due to the fact that, even though the first and the third transistor are substantially identical, like the second and the fourth transistor, the operating ranges of the identical transistors are not interrelated. This can be explained as follows. Each second transistor receives a control voltage which is determined by the voltage drop across the resistor. The voltage drop is caused by the currents through the channels of the third and the fourth transistor. However, the fourth transistor, being substantially identical to the second transistor, receives the voltage of the first power supply terminal on its gate electrode and experiences a driving voltage which is caused by the voltage drop across the resistor.

Each first transistor is controlled by a control voltage which varies, inter alia, in dependence on the number of stages, and on the voltage between the first power supply terminal and the second power supply terminal. Each first transistor then experiences a driving voltage which also changes with a change in the voltage between the power supply terminals. The gate electrode of the third transistor receives the voltage of the second supply terminal. The driving voltage of the third transistor, however, is determined by the voltage drop across the resistor. The first and the second transistor, therefore, operate in a range which deviates from the operating range of the third and the fourth transistor, respectively, so that the setting of the frequency stabilization means is not stable because it is still liable to drift.

SUMMARY OF THE INVENTION

It is an object of the invention to provide an oscillator comprising frequency stabilization means which offer a stable reference for the oscillation frequency and in which the oscillation frequency is less susceptible to parameter spreads which are unavoidably introduced during manufacture. To achieve this, an oscillator comprising frequency stabilization means in accordance with the invention is characterized in that the frequency stabilization means comprise:

a first current branch with a bias current source and a resistor which are connected to the second power supply terminal and the first power supply terminal, respectively, a second current branch with a further current source and a current path of a reference element which is substantially identical to the switching element, which further current source and current path are connected to the second power supply terminal and the first power supply terminal, respectively, the controllable current source and the further current source supplying substantially equal currents and being coupled to the bias current source so as to be controllable in the same sense, a control connection of the reference element being coupled to the resistor, feedback means for feeding back a voltage across the reference element in the second current branch to the first current branch so that the bias current source can be adjusted so that the ratio of a control voltage for the reference element and the current in the second current branch is substantially constant.

Via the resistor, the frequency stabilization means determine the ratio of the control voltage (switching threshold) on the input of the switching element, necessary for conducting the current to be supplied by the controllable current source, to that of the current to be supplied. The same ratio determines the oscillation frequency.

An embodiment of an oscillator comprising frequency stabilization means in accordance with the invention is characterized in that the bias current source, the further current source and the controllable current source form current mirrors comprising a first, a second and a third transistor, respectively, whose control electrodes are interconnected, the second and the third transistor being substantially identical, the first, the second and the third transistor being of a first conductivity type and having their respective current paths coupled to the second power supply terminal, the reference element and the switching element comprising a fourth and a fifth transistor, respectively, of a second conductivity type. As a result of the use of a current mirror, the currents supplied by the bias current source, the further current source and the controllable current source and their ratios are simply defined.

A further embodiment of an oscillator comprising frequency stabilization means in accordance with the invention is characterized in that the feedback means comprise a sixth transistor of the second conductivity type, a current path thereof being included in the first current branch between the resistor and the bias current source, a control electrode thereof being connected to the second current branch between the reference element and the further current source, the control electrodes of the first, and the second and the third transistor being connected to a junction point betweeen the sixth transistor and the bias current source. The simple feedback by means of the sixth transistor results in a stable setting of said ratio of the switching threshold and the current.

The realization of a stable current source by means of field effect transistors is known per se, see "Analysis and Design of Analog Integrated Circuits", Gray and Meyer, 1984, Wiley and Sons, Second Edition, page 732. In a circuit in accordance with the invention this known current source is used for defining, using the resistor present in the known current source, the cited ratio of the switching threshold and the current, which ratio occurs in an expression for the oscillation period.

A further drawback of the known oscillator consists in that a load on the output of the oscillator influences the oscillation frequency. This could be avoided by connecting a buffer to the output, for example, as in the circuit described in U.S. Pat. No. 4,072,910. Therein a buffer in the form of a further inverter is connected to the output of a ring oscillator provided with cascaded inverters. This buffer prevents the load from influencing the oscillation frequency, but temperature effects in the buffer itself will be noticeable in the signal at the output terminal of the buffer, for example, in the form of temperature-dependent edge steepnesses. It is an object of the invention to provide an oscillator comprising frequency stabilization means and an output stage which can be controlled by the frequency stabilization means.

To achieve this, a further embodiment of an oscillator comprising frequency stabilization means in accordance with the invention is characterized in that to the oscillator there is connected an output stage which comprises, between the first and the second power supply terminal, a series connection of an output current source, which is controllable by the frequency stabilization means, and a current path of an output switching element, a control input of the output switching element being connected between the controllable current source and the parallel connection, the output switching element being substantially identical to the reference element, the ratio of the currents supplied by the output current source and by the controllable current source being substantially constant. The additional output stage prevents the oscillation period from being influenced by a load which is coupled to the oscillator and which is fed with clock pulses. By controlling the output current source by means of the frequency stabilization means, moreover, the output signal of the output stage can be synchronized with an oscillator signal because the output stage comprises components which are identical to components in the oscillator. The oscillator signal is then temperature stabilized as far as an output of the output stage.

A further advantage consists in that the signal swing can be increased. To this end, the quotient of the current supplied by the output current source and the capacitive load on the output stage must exceed the quotient of the current supplied by the controllable current source and the capacitive load in the parallel connection within the oscillator.

A further embodiment of an oscillating comprising frequency stabilization means in accordance with the invention is characterized in that each of said current sources comprises a cascode connection of transistors of the first conductivity type. By realizing the bias current source, the further current source and the controllable current source by means of cascode connections, the output impedance of said current sources is increased, which further reduces the susceptibility of the oscillation period to supply voltage fluctuations.

BRIEF DESCRIPTION OF THE DRAWINGS

The invention will be described in detail hereinafter with reference to the accompanying drawing in which.

DESCRIPTION OF THE PREFERRED EMBODIMENTS

Figure 1:
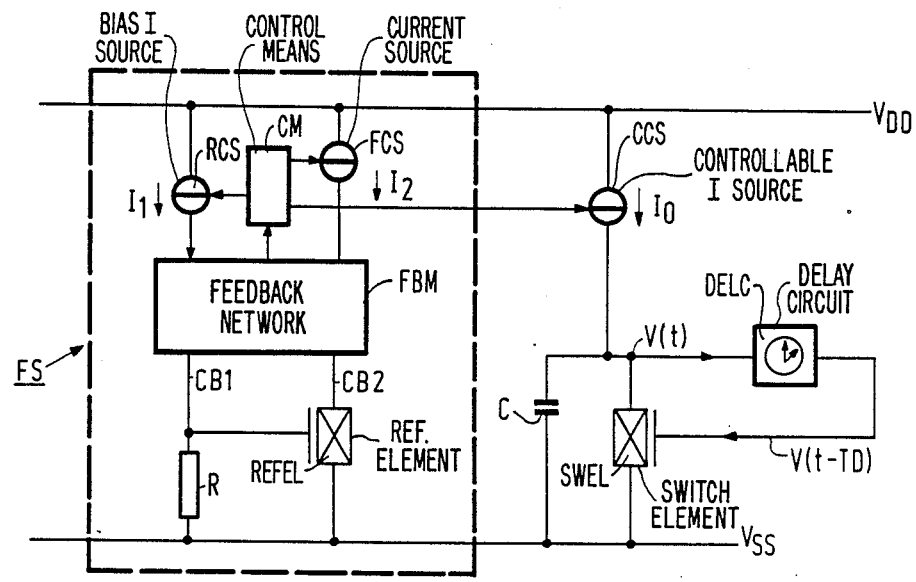
FIG. 1 shows the circuit diagram of an oscillator comprising frequency stabilization means in accordance with the invention.

FIG. 1 shows the circuit diagram of an oscillator comprising frequency stabilization means in accordance with the invention. The actual oscillator comprises a current source CCS, a parallel connection of a capacitive load C and a switching element SWEL along with a delay circuit DELC coupled between the capacitor C and a control input of the switching element. The delay circuit DELC comprises, for example, a passive RC network or, for example, three similar stages with CCS, C and SWEL, thus forming a known ring oscillator. The delay circuit DELC introduces a delay TD when a signal v(t) on the capacitive load C is conducted to the control input of the switching element SWEL. The current source CCS supplies a current IO which charges the capacitive load C or which is conducted by the switching element SWEL after a switching threshold VO is exceeded on the control input thereof. From these data it can be simply derived that the oscillation period T of the oscillator is given by: $T = 2TD + C(VO/IO)$. The switching threshold VO and the current IO, and hence the period T, are dependent on temperature, supply voltage and of parameter spreads incurred in the manufacturing process. In the expression for the oscillation period T, however, only the ratio of VO and IO occurs. For a stable oscillation period, therefore, a fixed ratio of these two quantities VO and IO suffices. Therefore, there are provided frequency stabilization means FS. These means comprise a first current branch CB1, a second current branch CB2, a reference element REFEL which is substantially identical to the switching element SWEL, a resistor R, a feedback network FBM between the first and the second current branch, a bias current source RCS which supplies a current I1, a control means CM which conduct a current I2, equal to IO, through the second current branch CB2, the ratio of I1 and IO being fixed: $I1 = a.IO$. The feedback network adjust the current applied to the resistor R so that the reference element REFEL conducts the current $I1 = IO$. This requires a control voltage equal to the switching threshold VO at the control input of the reference element REFEL. Thus, a voltage VO appears across the resistor R due to a current I1. Because the ratio of I1 and IO is fixed, it follows that the ratio of VO and IO depends only on the ratio numbers and the value of the resistor R which are substantially constant: $VO/IO = aVO/I1 = aR$. Substitution of this result in the expression for the oscillation period T leads to: $T = 2TD + aRC$. This expression now contains only constants.

Figure 2:
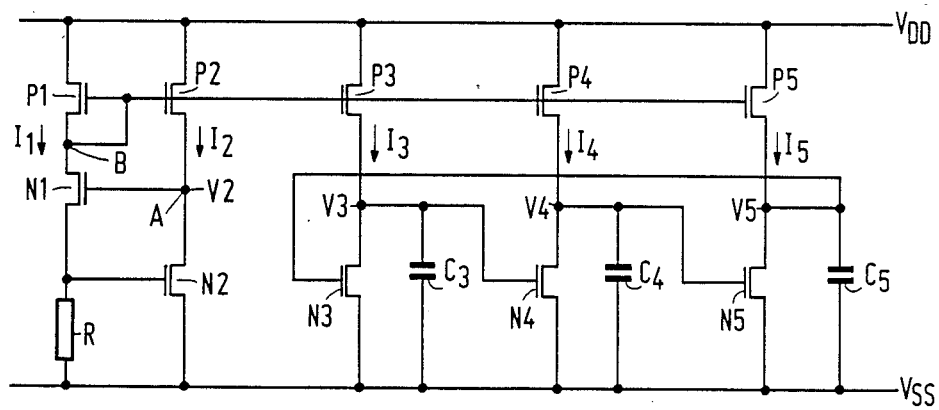
FIG. 2 shows a first embodiment of the circuit shown in FIG. 1.

FIG. 2 shows a first embodiment of the circuit in accordance with the invention. The oscillator is constructed as a known ring oscillator and comprises the P-channel MOS transistors P3, P4, P5, the N-channel MOS transistors N3, N4, N5 and the capacitive loads C3, C4, C5. Even though the latter components are explicitly shown, they may alternatively represent only the input capacitances of N4, N5 and N3, respectively. The frequency stabilization means comprise the P-channel MOS transistors P1 and P2, the N-channel MOS transistors N1 and N2 and the resistor R. The oscillation period in a ring oscillator is determined by the sum of the delay times of all stages.

As has already been described, the quotient of the switching threshold VO and the current IO must remain constant per stage in order to keep the oscillation period T constant. The P-channel transistors P1 to P5 shown in FIG. 2 are substantially identical, like the N-channel transistors N1 to N5 and the capacitive loads C3, C4, C5. The oscillation period T is then determined as follows. Each of the transistors P1 to P5, being connected as a current source, receives the same control voltage and, therefore, each transistor conducts a current I1 to I5 of the same magnitude. In a state of equilibrium this current is exactly large enough to produce across the resistor R the voltage required on the control electrode of transistor N2 in order to conduct the same current through transistor N2. The ratio of this voltage VO (the switching threshold) and the conducted current I2 then equals the value of the resistor R. When the switching element (N4) in a stage of the oscillator, for example P4, N4 and C4, is blocked so that the current source (P4) charges the capacitive load (C4), the voltage V4 on the control input of the switching element of the next stage (N5) increases. When the control voltage V4 reaches the switching threshold level VO, the switching element of the next stage (N5) then conducts the current from the associated current source (P5) and the associated capacitive load (C5) is discharged. The switching element (N3) in a subsequent stage (P3, N3 and C3) then receives a low control voltage V5 on its control input, so that this switching element (N3) is blocked and the associated capacitive load (C3) is charged by the relevant current source (P3). Consequently, the next stage (P4, N4 and C4) connected thereto receives an increasing voltage V3 on the control input of its switching element (N4), which control voltage V3 ensures that the relevant capacitive load (C4) is discharged once its voltage exceeds a switching threshold VO. In a ring oscillator circuit this pattern is cyclically shifted through the stages. The delay time per stage substantially approximates the period of time required for charging the relevant capacitance from a voltage equal to zero to the switching threshold of the switching element in the next stage, the switching element then conducts the current from the current source. When the impedance of the transistor N2 increases (and hence also that of the transistors N3, N4 and N5) due to a temperature rise, a higher switching threshold voltage V will be required in order to conduct the same current. The voltage V2 at the point A then increases, so that the transistor N1 will be more conductive and the voltage at the point B decreases, so that the current source I1 supplies more current, thus increasing the voltage across the resistor R. The transistor N2 increases to conduction until the voltage at the point A no longer increases. This is the case when the transistor N2 conducts all of the current supplied by the transistor P2. Because the transistor P1 supplies more current, the transistors P2 to P5 also do so. The ratio of the current and the switching threshold voltage then equals the value of R again, so that the oscillation period remains constant.

Figure 3:
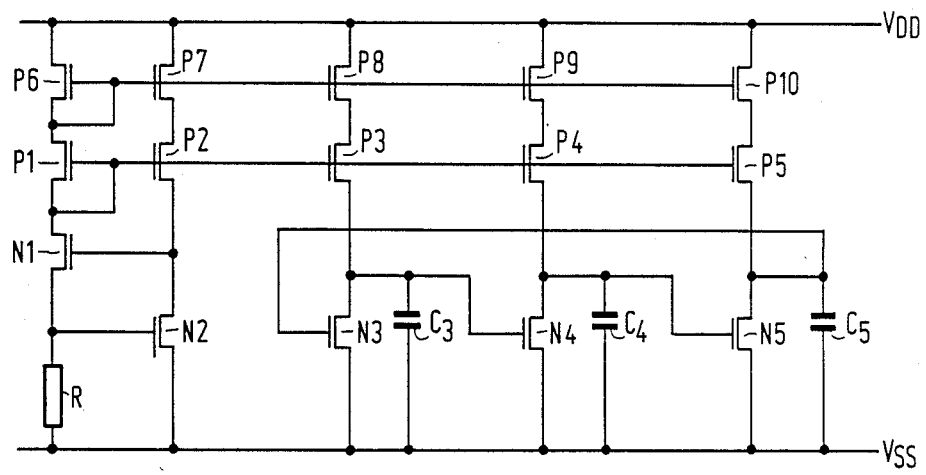
FIG. 3 shows a second embodiment of the circuit shown in FIG. 1.

FIG. 3 shows a further embodiment of the circuit shown in FIG. 2, elements which correspond to FIG. 2 are denoted by corresponding references. The circuit shown in FIG. 3 further comprises the P-channel transistors P6 to P10 which form, in conjunction with the transistors P1 to P5 the cascodes P1/P6 to P5/P10 respectively. The cascode connection increases the output impedance, thus reducing the susceptibility of the oscillation period T to fluctuations in the supply voltage $V_{DD}$.

Even though the transistors are shown as field effect transistors in FIGS. 2 and 3, equivalent circuits can be realized by means of bipolar transistors.

Figure 4:
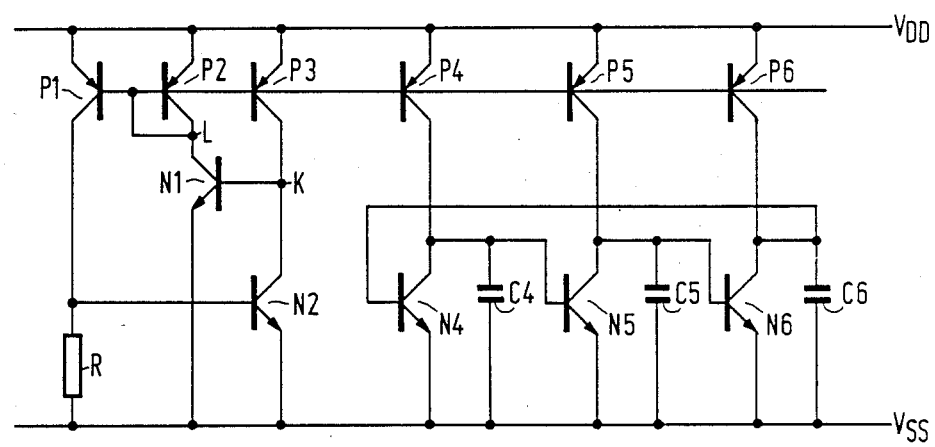
FIG. 4 shows a further embodiment of the circuit shown in FIG. 1.

FIG. 4 shows a further embodiment of an oscillator comprising frequency stabilization means in accordance with the invention. The oscillator comprises the PNP transistors P4, P5 and P6, the NPN transistors N4, N5, N6, and the capacitances C4, C5 and C6. The frequency stabilization means comprise the PNP transistors P1, P2 and P3, the NPN transistors N1, N2 and the resistor R. Feedback is now realized via the transistors N1 and P2.

In a state of equilibrium, the transistors P1, P2 and P3 supply as much current as is drained by the resistor R, the transistor N1 and the transistor N2, respectively. The voltage across the resistor R just suffices to make the transistor N conduct the current from the transistor P3 minus the base current of the transistor N1. Because the transistor N1 is smaller than the transistor N2, as will be described hereinafter, the base current of the transistor N1 can be ignored. The transistor N1 acts as a sensor for the voltage at the junction point K. Deviations of the voltage at the junction point K from the state of equilibrium make the transistor N1 conduct more or less, so that the voltage at the junction point L also fluctuates. The voltage at the junction point L subsequently controls the currents through the transistors P1 and P3. The transistor N1 is smaller than the transistor N2 because the transistor N1 drains the base currents of the transistors P1 and P3 as well as the current through the small transistor P2. The transistor P2 is smaller than the transistors P1 and P3 because the transistor P2 forms, in conjunction with the transistor N1, a voltage divider whose output voltage, being the voltage at the terminal L, controls the transistors P1 and P3. Consequently, the transistor P2 need not conduct large currents.

What is claimed is:

1. An oscillator comprising, connected between a first and a second power supply terminal, a series connection of a current source which is controllable by frequency stabilization means and which is connected to the second power supply terminal and a parallel connection of a capacitive load and a current path of a switching element, which parallel connection is connected to the first power supply terminal, a junction point between the controllable current source and the parallel connection being fed back, via a delay circuit, to a control connection of the switching element, characterized in that the frequency stabilization means comprise:

a first current branch including a bias current source and a resistor which are connected to the second power supply terminal and the first power supply terminal, respectively, a second current branch including a further current source and a current path of a reference element which is substantially identical to the switching element, which further current source and current path are connected to the second power supply terminal and the first power supply terminal, respectively, the controllable current source and the further current source supplying substantially equal currents and being coupled to the bias current source so as to be controllable in the same sense, a control connection of the reference element being coupled to the resistor, and feedback means for feeding back a voltage across the reference element in the second current branch to the first current branch so that the bias current source can be adjusted such that the ratio of a control voltage for the reference element and the current in the second current branch is substantially constant.

2. An oscillator as claimed in claim 1, wherein the bias current source, the further current source and the controllable current source form current mirrors comprising a first, a second and a third transistor, respectively, whose control electrodes are interconnected, the second and the third transistor being substantially identical, the first, the second and the third transistor being of a first conductivity type and having their respective current paths coupled to the second power supply terminal, the reference element and the switching element comprising a fourth and a fifth transistor, respectively, of a second conductivity type.

3. An oscillator as claimed in claim 2, wherein the feedback means comprise a sixth transistor of the second conductivity type having a current path included in the first current branch between the resistor and the bias current source, a control electrode thereof being connected to a junction point in the second current branch between the reference element and the further current source, and means connecting the control electrodes of the first, the second and the third transistor to a junction point between the sixth transistor and the bias current source.

4. An oscillator as claimed in claim 2, wherein the feedback means comprise a sixth and a seventh transistor of the first and the second conductivity type, respectively, means connecting the current paths of the sixth and the seventh transistor in series between the second power supply terminal and the first power supply terminal, means connecting a control electrode of the sixth transistor to the control electrodes of the first, the second and the third transistor and to a junction point between the current paths of the sixth and the seventh transistor, a control input of the seventh transistor being connected to a junction point in the second current branch between the second transistor and the reference element.

5. An oscillator as claimed in claim 1, 2, 3 or 4, further comprising an output stage coupled to the oscillator, and wherein the output stage comprises, between the first and the second power supply terminal, a series connection of an output current source, which is controllable by the frequency stabilization means, and a current path of an output switching element, a control input of the output switching element being connected between the controllable current source and the parallel connection, the output switching element being substantially identical to the reference element, the ratio of the currents supplied by the output current source and by the controllable current source being substantially constant.

6. An oscillator as claimed in claim 2, 3, or 4, characterized in that each of said current sources comprises a cascode connection of at least two transistors of the first conductivity type.

7. An oscillator as claimed in claims 1, 2, 3 or 4, characterized in that the bias current source supplies a current which is substantially identical to the current supplied by the further current source.

8. An oscillator as claimed in claims 1, 2, 3 or 4, characterized in that the resistor is variable.

* * * * *